(12) United States Patent
Premerlani et al.

(10) Patent No.: US 7,328,114 B2
(45) Date of Patent: Feb. 5, 2008

(54) METHODS AND SYSTEMS FOR MEASURING A RATE OF CHANGE OF FREQUENCY

(75) Inventors: William Premerlani, Scotia, NY (US); Rui Zhou, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 7 days.

(21) Appl. No.: 11/298,964

(22) Filed: Dec. 9, 2005

(65) Prior Publication Data

US 2007/0136013 A1    Jun. 14, 2007

(51) Int. Cl.
*G01R 23/16* (2006.01)

(52) U.S. Cl. ........................................ 702/75
(58) Field of Classification Search ............... 702/75
See application file for complete search history.

(56) References Cited

U.S. PATENT DOCUMENTS

| | | |
|---|---|---|
| 3,715,718 A | 2/1973 | Astengo |
| 3,947,004 A | 3/1976 | Taylor |
| 4,463,306 A | 7/1984 | de Mello et al. |
| 4,547,726 A | 10/1985 | Premerlani |
| 4,609,990 A | 9/1986 | Sember et al. |
| 4,661,769 A | 4/1987 | Girgis |
| 4,680,741 A | 7/1987 | Wales et al. |
| 4,774,959 A | 10/1988 | Palmer et al. |
| 4,792,956 A | 12/1988 | Kamin |
| 4,837,705 A | 6/1989 | Mussler et al. |
| 4,843,419 A | 6/1989 | Sato |
| 4,869,254 A | 9/1989 | Stone et al. |
| 5,061,890 A | 10/1991 | Longini |
| 5,078,136 A | 1/1992 | Stone et al. |
| 5,216,621 A | 6/1993 | Dickens |
| 5,343,209 A | 8/1994 | Sennott et al. |
| 5,361,775 A | 11/1994 | Remes et al. |
| 5,391,983 A | 2/1995 | Lusignan et al. |
| 5,402,452 A | 3/1995 | Powell et al. |
| 5,528,530 A | 6/1996 | Powell et al. |
| 5,548,209 A | 8/1996 | Lusignan et al. |
| 5,639,962 A | 6/1997 | Maloney |
| 5,678,402 A | 10/1997 | Kitagawa et al. |
| 5,721,689 A * | 2/1998 | Hart et al. ............ 702/75 |
| 5,724,309 A | 3/1998 | Higgs et al. |
| 5,739,870 A | 4/1998 | Simpson |
| 5,832,413 A | 11/1998 | Benco et al. |
| 5,832,414 A * | 11/1998 | Hart et al. ............ 702/77 |
| 5,890,111 A | 3/1999 | Javkin et al. |
| 5,931,890 A | 8/1999 | Suwa et al. |
| 6,185,482 B1 | 2/2001 | Egolf et al. |
| 6,266,996 B1 | 7/2001 | Livingston |
| 6,717,394 B2 | 4/2004 | Elms |
| 6,856,281 B2 * | 2/2005 | Billington et al. ........ 342/174 |

(Continued)

*Primary Examiner*—John Barlow
*Assistant Examiner*—Aditya S. Bhat
(74) *Attorney, Agent, or Firm*—Rodney M. Young; Armstrong Teasdale LLP

(57) ABSTRACT

A method for measuring a rate of change of frequency includes estimating at least one phasor value, estimating a frequency based on the estimated at least one phasor value, compensating the estimated at least one phasor value based on the estimated frequency, calculating a frequency based on the compensated at least one phasor value, and calculating a rate of change of the calculated frequency based on the calculated frequency.

23 Claims, 5 Drawing Sheets

U.S. PATENT DOCUMENTS

| | | |
|---|---|---|
| 7,035,124 B2 | 4/2006 | Chadwick et al. |
| 7,066,008 B2 | 6/2006 | Niewczas et al. |
| 7,072,692 B1 | 7/2006 | Katz et al. |
| 7,079,257 B1 | 7/2006 | Kirkpatrick et al. |
| 2002/0096296 A1 | 7/2002 | Sasaki |
| 2004/0156349 A1 | 8/2004 | Borisovich et al. |
| 2005/0190098 A1 | 9/2005 | Bridgelall et al. |
| 2006/0142634 A1 | 6/2006 | Anstadt et al. |

* cited by examiner

METHODS AND SYSTEMS FOR MEASURING A RATE OF CHANGE OF FREQUENCY

BACKGROUND OF THE INVENTION

This invention relates generally to measuring frequency, and more particularly to methods and systems for measuring a rate of change of frequency.

Mechanical frequency limits are sometimes established to protect an electrical generator prime mover, typically a turbine. For example, it may be generally undesirable to operate a turbine above or below predetermined mechanical resonance limits and/or frequencies. Accordingly, it may be important to monitor an operating frequency of the turbine. An electrical signal frequency, indicative of turbine mechanical frequency, may therefore be monitored to determine whether the frequency is within predetermined electrical frequency limits, and thereby facilitate operating the turbine within the predetermined band of mechanical frequencies. Moreover, before interconnecting loads supplied by different generators, it may be desirable that both generators are operating at the same electrical frequency to prevent voltage surges and voltage transients, which may damage the loads should interconnection of non-synchronous generators be attempted.

At least some known electrical power frequency and frequency rate of change measurement techniques measure the time between zero crossings of the voltage waveform, and generate frequency and/or frequency rate of change values from the zero crossing measurements. For example, at least some known measurement techniques include estimating frequency from the zero crossing measurements, and estimating frequency rate of change by subtracting pairs of frequency measurements. However, at least some of such known measuring techniques may be sensitive to noise on the power lines because of large frequency changes naturally occurring in the utility network, voltage spikes, and/or voltage glitches, which may be detected as zero crossings of the voltage waveform thereby leading to erroneous frequency determinations. Moreover, non-fundamental components of the electrical power system may produce signals detected as zero crossings, which may also produce erroneous frequency results.

Improper and/or erroneous frequency determinations may lead to costly premature system shutdown if the system frequency does not actually exceed the predetermined frequency limits and the frequency monitor indicates it does exceed the limits. Moreover, if the system frequency does actually exceed the predetermined limits and the frequency monitor indicates it does not exceed the limits, improper and/or erroneous frequency determinations may result in damage to a prime mover and/or other electrical power system components. Furthermore, non-synchronous generators may be interconnected, resulting in problems described above, for example if the frequency monitor erroneously indicates that the frequencies of the generators are the same. At least some known frequency measurement techniques that use zero crossing measurements may also be less accurate than desirable, for example if the measured signal is not a perfect sinusoid. Moreover, at least some known electrical power systems include distributed generators, which may sometimes require anti-islanding control. However, at least some known frequency measurement techniques that use zero crossing measurements may include a non-detection zone (NDZ), and therefore may not be able to prevent unintentional islanding under power match conditions.

BRIEF DESCRIPTION OF THE INVENTION

In one aspect, a method is provided for measuring a rate of change of frequency. The method includes estimating at least one phasor value, estimating a frequency based on the estimated at least one phasor value, compensating the estimated at least one phasor value based on the estimated frequency, calculating a frequency based on the compensated at least one phasor value, and calculating a rate of change of the calculated frequency based on the calculated frequency.

In another aspect, a method is provided for measuring a rate of change of frequency. The method includes estimating at least one phasor value, compensating the estimated at least one phasor value, calculating at least one positive sequence phasor value, estimating a frequency based on the calculated positive sequence phasor value, and calculating a rate of change of the estimated frequency based on the estimated frequency.

DETAILED DESCRIPTION OF THE INVENTION

Although the systems and methods described and/or illustrated herein are described and/or illustrated with respect to an electrical power system, and more specifically single-phase and three-phase electrical power systems, practice of the systems and methods described and/or illustrated herein is not limited to single-phase or three-phase electrical power systems, nor electrical power systems generally. Rather, the systems and methods described and/or illustrated herein are applicable to determining the frequency and/or frequency rate of change from a desired frequency for any periodic function or motion from which a parameter representative of the periodic function or motion is available to define a phasor that represents the function and/or motion. As used herein, a phasor is intended to mean a quantity having both magnitude and direction, such as, but not limited to, a +jb (rectangular coordinates) and $Ze^{-j\theta}$ (polar coordinates), used to represent a time-varying quantity. Some examples of systems having periodic functions and/or motion include, but are not limited to, electrical power systems and rotating mechanical systems. In some embodiments, at least one technical effect of the systems and methods described herein includes measuring a frequency rate of change in a system, for example an electrical power system.

Figure 1:
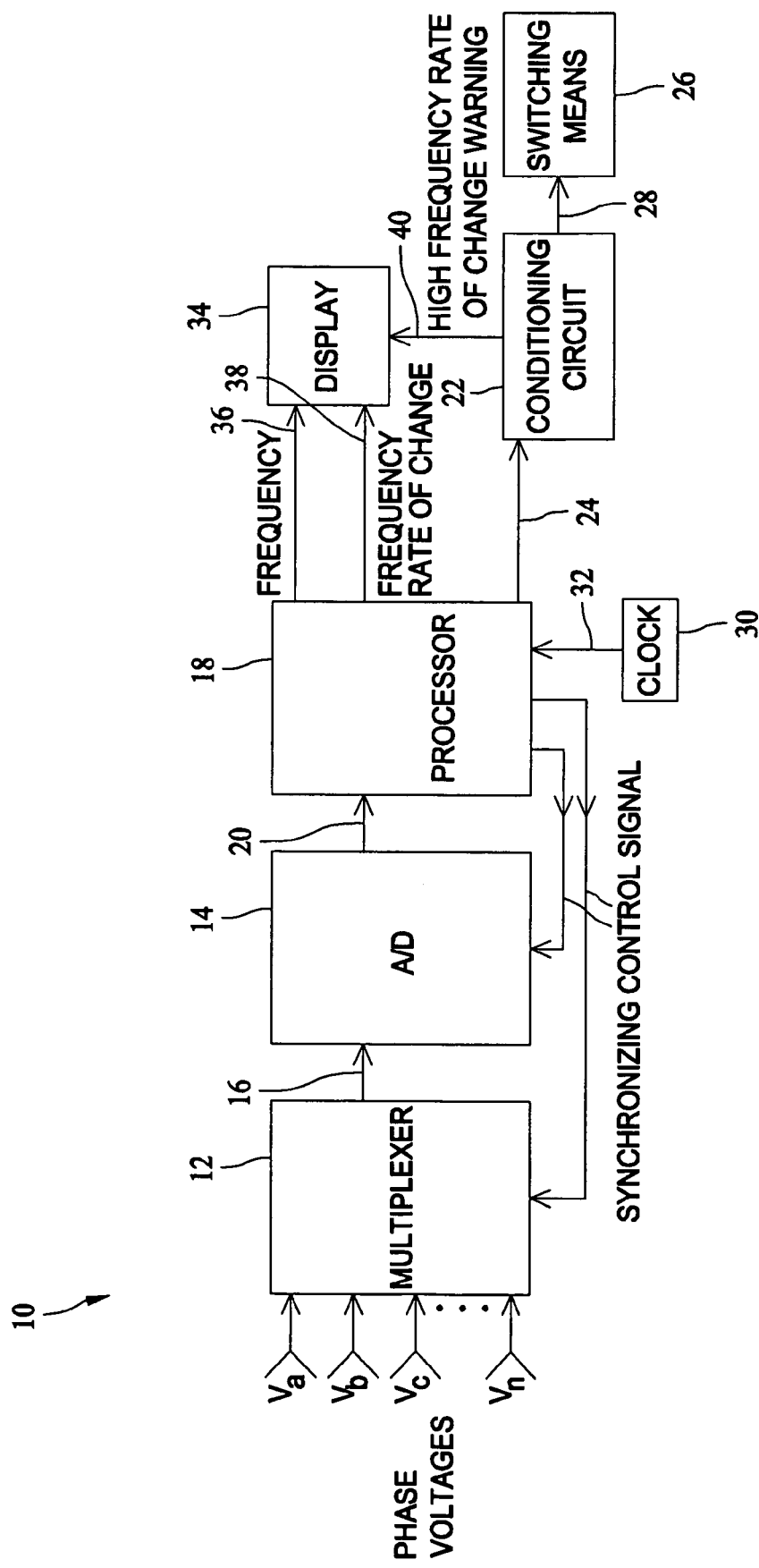
FIG. 1 is a block diagram of an exemplary embodiment of a system for determining frequency and/or frequency rate of change in an electrical power system in response to monitored circuit parameters.

FIG. 1 is a block diagram of an exemplary embodiment of a system 10 for determining frequency and/or frequency rate of change in an electrical power system (not shown) in response to monitored parameters of the electrical power system. Although system 10 is described and/or illustrated herein with respect to single-phase and a three-phase electrical power systems, system 10 may be used to determine electrical power system frequency and/or frequency rate of change of an electrical power system having any number of phases.

System 10 includes a multiplexer 12 supplied with a parameter, such as, but not limited to, line-to-neutral or line-to-line phase voltage $V_a$, $V_b$, $V_c$ ... $V_n$, which may be appropriately scaled, wherein a, b, c ... n differentiate a parameter of one phase from each other phase of the electrical power system. System 10 also includes an analog-to-digital (A/D) converter 14 coupled to an output 16 of multiplexer 12, a processor 18 coupled to an output 20 of A/D converter 14, a conditioning circuit 22 coupled to an output 24 of processor 18, a switching means 26, such as, but not limited to, a relay or contactor, coupled to an output 28 of conditioning circuit 22, clock circuitry 30 having an output 32 coupled to processor 18, and a display 34 coupled to a plurality of outputs 36 and 38 of processor 18 that supply frequency and frequency rate of change, respectively, to display 34. Display 34 is also coupled to an output 40 of conditioning circuit 22 that supplies high frequency rate of change warning signals to display 34. Switching means 26 may provide control for removing power to all or a selected portion of the electrical power system, for example when a high frequency rate of change condition exists in the electrical power system. Conditioning circuit 22 may determine whether any frequency rate of change limits are exceeded.

Processor 18 may be any suitable processor capable of performing the functions described herein. For example, and although other processors may be used, in some embodiments processor 18 includes a digital signal processor (DSP) such as, but not limited to, a TMS320 DSP, available from Texas Instruments, Inc. of Dallas, Tex. Although other processors may be used, another example of processor 18 includes a microprocessor, such as, but not limited to, a PowerPC, available from International Business Machines Corporation of Armonk, N.Y. In some embodiments, processor 18 includes an integrated read only memory (ROM, not shown), in which a program may be stored. In other embodiments, a separate ROM (not shown) may be interfaced with processor as is known in the art, whether processor 18 includes an integrated ROM. Clock circuitry 30 may include a crystal oscillator (not shown) for providing a master frequency signal and/or divider circuitry (not shown) for providing fractional multiple frequency signals of the master frequency signal to processor 18 for timing and/or synchronization.

In some embodiments, the timing for triggering an output signal from multiplexer 12 and actuating analog-to-digital conversion in A/D converter 14 is provided by synchronizing control signals available at appropriate outputs of processor 18 and supplied to the appropriate unit. Multiplexer 12 may act as a switch having multiple inputs, each capable of supplying a corresponding signal to the output thereof in response to the status of the synchronizing control signal supplied thereto.

In some embodiments, A/D converter 14 outputs a signal that is a binary digital representation of the respective sampled phase parameter input signal, e.g. phase A voltage $V_a$, supplied from multiplexer output 16. In some embodiments, A/D converter 14 may provide a digital output signal that is compatible with processor 18. However, if the digital output signal is not voltage compatible, a buffer (not shown) or logic level shifter (not shown) may interface between A/D converter output 20 and processor 18. Moreover, if the output signal is not bit compatible (e.g. A/D converter 14 provides more than 8 bits output while processor 18 can only use 8 bits at a time), then a data latch (not shown) controlled by processor 18 may interface between A/D converter output 20 and processor 18.

In some embodiments, the frequency and/or frequency rate of change signal outputs of processor 18 are binary digital representations of the respective parameters. In some embodiments, display means 34 includes a meter (not shown) and/or numeric indicator (not shown) for indicating actual frequency and/or frequency rate of change. Moreover, in some embodiments display means 34 includes visual means (not shown), such as, but not limited to, a colored or flashing light, and/or audio means (not shown), such as, but not limited to, a bell, a whistle, and/or a siren, for providing indication of a high frequency rate of change condition.

Figure 2:
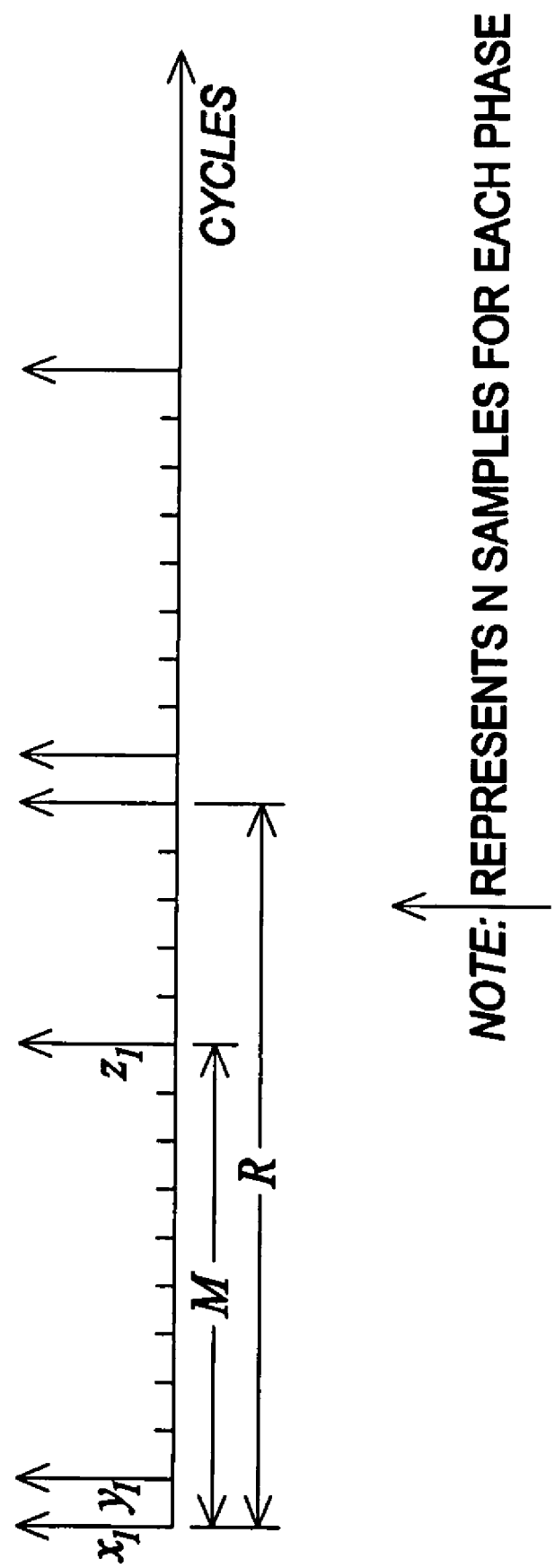
FIG. 2 is a diagram of an exemplary embodiment of a sampling operation for use determining frequency and/or frequency rate of change.
Figure 3:
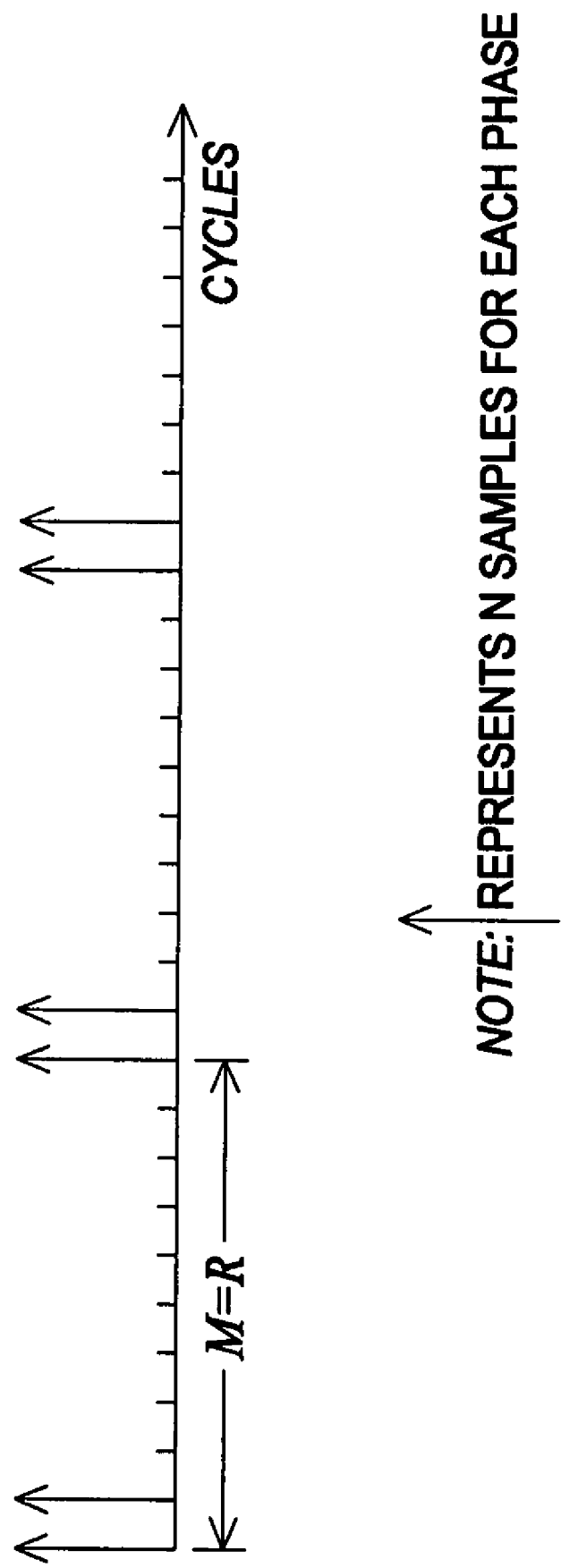
FIG. 3 is a diagram of another exemplary embodiment of a sampling operation for use determining frequency and/or frequency rate of change.

FIG. 2 is a diagram of an exemplary embodiment of a sampling operation for use determining frequency and/or frequency rate of change. FIG. 3 is a diagram of another exemplary embodiment of a sampling operation for use determining frequency and/or frequency rate of change. Line-to-neutral or line-to-line voltages are sampled N times per cycle per phase. In some embodiments, N is controlled by a program stored in processor 18 (shown in FIG. 1) which coordinates the synchronizing control signals supplied to multiplexer 12 (shown in FIG. 1) and A/D converter 14 (shown in FIG. 1).

In some embodiments, increasing the number of phases supplying samples facilitates increasing an accuracy of a determined frequency and/or frequency rate of change. Moreover, a higher sampling rate may sometimes facilitate greater accuracy. Although any suitable sampling rate may be used, in some embodiments, and for example, a sampling rate of between 8 and 24 samples per cycle is used. For example, in some embodiments a sampling rate of 12 samples per cycle is used. In some embodiments, the sampling rate N is at least 4 samples per cycle and/or is an even number to facilitate removing any DC offset in the measured voltages. Samples for each phase, in some embodiments, may be evenly spaced over a cycle. It may be possible, in some embodiments, to use samples from less than or more than a complete cycle of the signal being sampled, in which case it is assumed that a portion of the signal not sampled is symmetrical to the portion which is sampled. For example, if only the first half of a cycle is sampled, it is assumed that the second half of the cycle is negatively symmetrical (mirror image) with the sampled first half.

FIG. 2 illustrates an exemplary embodiment of a sampling operation wherein samples are taken during consecutive cycles $x_1$ and $y_1$, and at a later cycle $z_1$, M cycles after cycle $x_1$. Selection of the value M is described below. The selection pattern is repeated R cycles after cycle $x_1$. The value of R may be selected to provide a desired transient response, i.e. how often the-frequency and frequency rate of change values are updated. Although R may have any suitable value, in some embodiments R is about 0.5 seconds.

FIG. 3 illustrates another exemplary embodiment of a sampling operation wherein M=R. Any pair of samples may be used, for example $x_1$, $y_1$; $x_1$, $z_1$; $y_1$, $z_1$, providing the range criteria described below are satisfied. Using consecutive cycle samples, for example $x_1$, $y_1$, may facilitate providing a monitoring range having a greater frequency rate of change while having less accuracy. Using spaced cycle samples, for example $x_1$, $z_1$, may facilitate providing a monitoring range having a lesser frequency rate of change while having greater accuracy.

Data may be required from two consecutive sets of samples every M cycles, wherein M is greater than or equal to two. The value of M may establish computational loading of processor 18 and/or transient response. As M decreases, the transient response delay to a step change in frequency may also decrease, sometimes at the expense of increased computational burden. Although M may have any suitable value, in some embodiments M is ten. To facilitate minimum response delay, data may be taken for every cycle in which M is equal to two.

Figure 4:
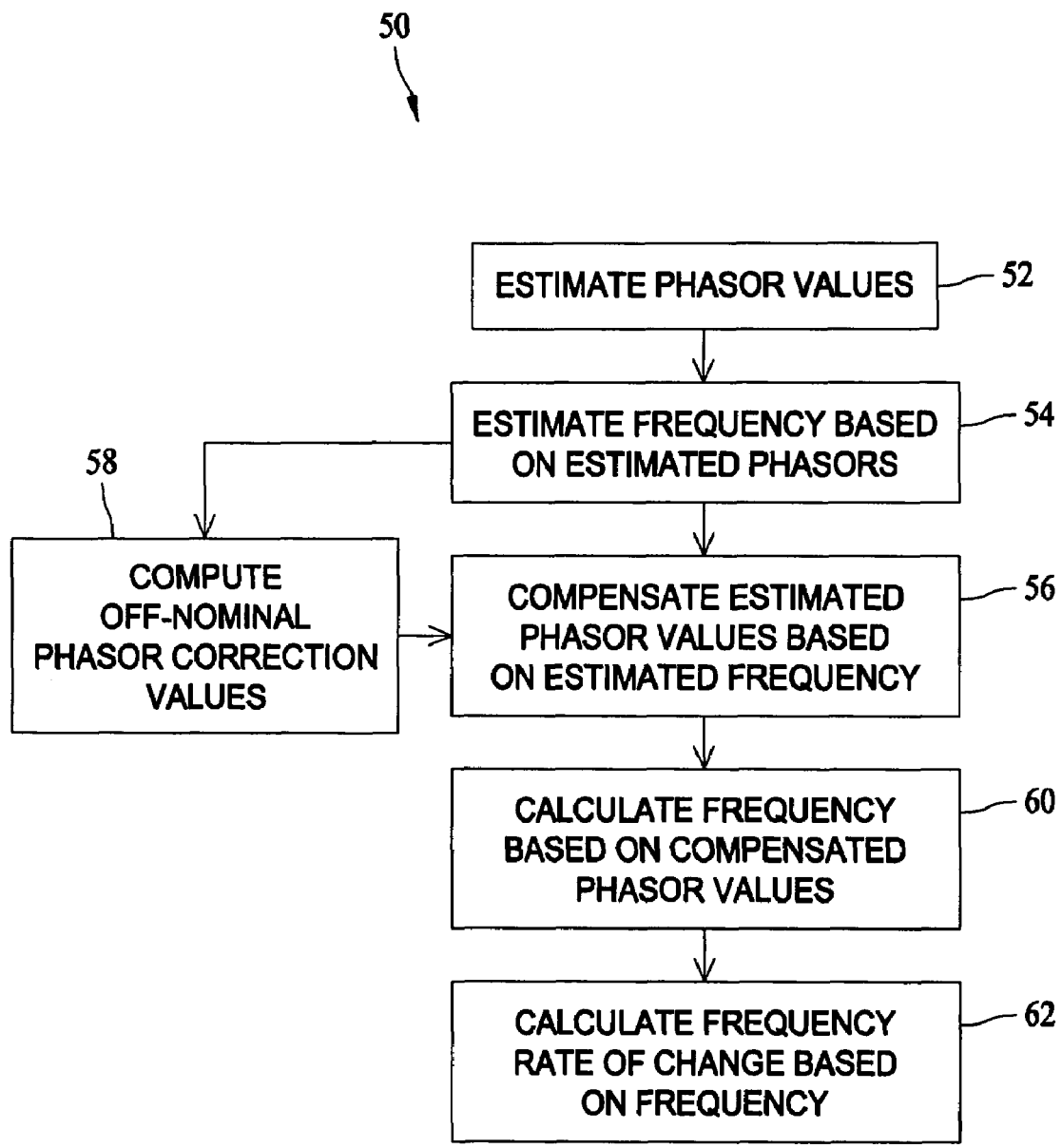
FIG. 4 is a flowchart illustrating an exemplary embodiment of a method of measuring a frequency rate of change.

FIG. 4 is a flowchart illustrating an exemplary embodiment of a method 50 for measuring frequency rate of change, using for example, system 10 (shown in FIG. 1). Method 50 includes estimating 52 current or voltage phasor values, and estimating 54 frequency based on the estimated phasor values. In some embodiments, estimating 54 frequency includes estimating frequency based on rotational rates of the estimated phasor values. Moreover, in some embodiments estimating 54 frequency includes estimating frequency based on rotational rates of a positive sequence. Method 50 also includes compensating 56 the estimated phasor values based on the estimated 54 frequency. In some embodiments, method 50 includes computing 58 off-nominal phasor correction values based on estimated 54 frequency, and compensating 56 the estimated phasor values based on the computed 58 off-nominal phasor values. Method 50 also includes calculating 60 frequency based on the compensated 56 phasor values, and calculating 62 frequency rate of change based on the calculated frequency.

Although method 50 may be accomplished using any suitable set of equations, one exemplary embodiment described herein with respect to a single-phase electrical power system follows. The voltage or current phasor can be estimated 52 using the following equation(s):

$$\bar{X} = \frac{\sqrt{2}}{N} \sum_{k=-\frac{N}{2}}^{\frac{N}{2}-1} x[(k+1/2) \cdot \Delta t] \cdot e^{-j(k+1/2)\frac{2\pi}{N}} \quad (1)$$

wherein:
$\bar{X}$: Phasor estimate;
N: Number of samples per cycle;

$$\Delta t = \frac{1}{N \cdot f};$$

Sampling time step; and
f: Power system nominal frequency (60 Hz in the United States, 50 Hz in Europe).

During off-nominal power system frequency one can derive the "true" phasor from the phasor estimate. In some embodiments, the relationship between the "true" phasor and the phasor estimate is:

$$\bar{X} = A \cdot X + B \cdot X^* \quad (2)$$

wherein:
X: Actual phasor value;
X*: Conjugate of the actual phasor;

$$A = \frac{\sin(\pi \cdot \Delta f / f)}{N \cdot \sin\left(\frac{\pi}{N} \cdot \Delta f / f\right)};$$

Compensation coefficient;

$$B = \frac{\sin(\pi \cdot \Delta f / f)}{N \cdot \sin\left(2\frac{\pi}{N} + \frac{\pi}{N}\Delta f / f\right)};$$

$\Delta f = f_\alpha - f$: Frequency deviation; and
$f_\alpha$: Power system actual frequency.
Re-arrange equation (2):

$$X = C \cdot \bar{X} - D \cdot \bar{X}^* \quad (3)$$

wherein, $$C = \frac{A}{A^2 - B^2};$$

Compensation coefficient; and $$D = \frac{B}{A^2 - B^2};$$

Compensation coefficient.

The compensation coefficients C and D can be approximated via Taylor expansion:

$$C \approx 1 + \left(\frac{1}{6} \cdot \pi^2 + \frac{1}{4}\right) \cdot (\Delta f / f)^2 \quad (4a)$$

$$D \approx \frac{1}{2} \cdot \Delta f / f - \frac{1}{4} \cdot (\Delta f / f)^2 \quad (4b)$$

Given the basic phasor calculation under off-nominal frequency conditions, method 50 can be summarized as follows. Although any cycle may be used, note that the phasor calculation is updated every half cycle.

Estimate 52 current or voltage phasor every half cycle:

$$\bar{X}(m) = \frac{\sqrt{2}}{N} \sum_{k=m\frac{N}{2}-\frac{N}{2}}^{m\frac{N}{2}+\frac{N}{2}-1} x[(k+1/2) \cdot \Delta t] \cdot e^{-j\left(k-m\frac{N}{2}+1/2\right)\frac{2\pi}{N}} \quad (5)$$

wherein:
m: Half cycle index.

Estimate 54 frequency:

$$E_{cs}(m) = \overline{X}(m) \cdot \overline{X}(m-1)^*  \quad (6a)$$

$$f_{cs}(m) = f + \frac{f}{\pi} \cdot a\tan\left(\frac{\mathrm{Im}(E_{cs}(m))}{\mathrm{Re}(E_{cs}(m))}\right) \quad (6b)$$

wherein:
$f_{cs}$: Coarse frequency estimate.

Compensate 56 the estimated phasor value based on the estimated 54 frequency:

$$\Delta f(m) = f_{cs}(m) - f \quad (7a)$$

$$X(m) = \left[1 + \frac{1}{6} \cdot \pi^2 + \frac{1}{4}\right] \cdot (\Delta f(m)/f)^2 \right] \cdot \overline{X(m)} - \quad (7b)$$
$$\left[\frac{1}{2} \cdot \Delta f(m)/f - \frac{1}{4} \cdot (\Delta f(m)/f)^2\right] \cdot \overline{X(m)}^*$$

Calculate 60 frequency based on the compensated 56 phasor value:

$$E_a(m) = X(m) \cdot X(m-1)^* \quad (8a)$$

$$f_a(m) = f + \frac{f}{\pi} \cdot a\tan\left(\frac{\mathrm{Im}(E_a(m))}{\mathrm{Re}(E_a(m))}\right) \quad (8b)$$

Calculate 62 frequency rate of change based on the calculated frequency:

$$\frac{df}{dt} = 2f \cdot (f_a(m) - f_a(m-1)) \quad (9)$$

Although method 50 may be accomplished using any suitable set of equations, one exemplary embodiment described herein with respect to a three-phase electrical power system follows. One can use the positive sequence phasor to facilitate enhancing the accuracy of measuring frequency rate of change. The positive and negative sequence phasors hold the following relationships:

$$\overline{X}_{pos} = A \cdot X_{pos} + B \cdot X_{neg}^* \quad (10)$$

$$\overline{X}_{neg} = A \cdot X_{neg} + B \cdot X_{pos}$$

wherein:
$\overline{X}_{pos}$, $\overline{X}_{neg}$: Positive/Negative sequence phasor estimates;
$X_{pos}^*$, $X_{neg}^*$: Conjugates of the actual positive/negative phasors;

$$A = \frac{\sin(\pi \cdot \Delta f / f)}{N \cdot \sin\left(\frac{\pi}{N} \cdot \Delta f / f\right)};$$

Compensation coefficient;

$$B = \frac{\sin(\pi \cdot \Delta f / f)}{N \cdot \sin\left(2\frac{\pi}{N} + \frac{\pi}{N} \cdot \Delta f / f\right)};$$

Compensation coefficient;
$\Delta f = f_\alpha - f$: Frequence deviation; and
$f_\alpha$: Real power system frequency.

Re-arranging equation (10):

$$X_{pos} = C \cdot \overline{X}_{pos} - D \cdot \overline{X}_{neg}^* \quad (11)$$

wherein:

$$C = \frac{A}{A^2 - B^2};$$

Compensation coefficient; and $$D = \frac{B}{A^2 - B^2};$$

Compensation coefficient.

As with a single-phase system, C and D can be simplified according to equations (4a) and (4b). Method 50 can be summarized as follows. Although any cycle may be used, note that the phasor calculation is updated every half cycle.

Estimate 52 the three phase phasor estimates every half cycle:

$$\overline{X}_a(m) = \frac{\sqrt{2}}{N} \sum_{k=m\frac{N}{2}-\frac{N}{2}}^{m\frac{N}{2}+\frac{N}{2}-1} x_a[k+1/2] \cdot \Delta t] \cdot e^{-j(k-m\frac{N}{2}+1/2)\frac{2\pi}{N}} \quad (12)$$

$$\overline{X}_b(m) = \frac{\sqrt{2}}{N} \sum_{k=m\frac{N}{2}-\frac{N}{2}}^{m\frac{N}{2}+\frac{N}{2}-1} x_b[k+1/2] \cdot \Delta t] \cdot e^{-j(k-m\frac{N}{2}+1/2)\frac{2\pi}{N}}$$

$$\overline{X}_c(m) = \frac{\sqrt{2}}{N} \sum_{k=m\frac{N}{2}-\frac{N}{2}}^{m\frac{N}{2}+\frac{N}{2}-1} x_c[k+1/2] \cdot \Delta t] \cdot e^{-j(k-m\frac{N}{2}+1/2)\frac{2\pi}{N}}$$

wherein: m: Half cycle index.

Calculate positive and negative phasor estimates:

$$\overline{X}_{pos}(m) = \frac{1}{3}[\overline{X}_a(m) + a\overline{X}_b(m) + a^2\overline{X}_c(m)] \quad (13)$$

$$\overline{X}_{neg}(m) = \frac{1}{3}[\overline{X}_a(m) + a^2\overline{X}_b(m) + a\overline{X}_c(m)]$$

wherein: $a = e^{j\frac{2\pi}{3}}$.

Estimate 54 frequency based on the estimated positive sequence phasor:

$$E_{cs}(m) = \overline{X}_{pos}(m) \cdot \overline{X}_{pos}(m-1)^* \quad (14a)$$

$$f_{cs}(m) = f + \frac{f}{\pi} \cdot a\tan\left(\frac{\mathrm{Im}(E_{cs}(m))}{\mathrm{Re}(E_{cs}(m))}\right) \quad (14b)$$

wherein: $f_{cs}$: Coarse frequency estimate.

Compensate 56 the positive sequence phasor based on the estimated 54 frequency:

$$\Delta f(m) = f_{cs}(m) - f \quad (15a)$$

$$X_{pos}(m) = \left[1 + \frac{1}{6} \cdot \pi^2 + \frac{1}{4}\right] \cdot (\Delta f(m)/f) \cdot \quad (15b)$$

$$\overline{X}_{pos}(m) - \left[\frac{1}{2} \cdot \Delta f(m)/f - \frac{1}{4} \cdot (\Delta f(m)/f)^2\right] \cdot \overline{X}_{neg}(m)^*$$

Calculate 60 frequency based on the compensated 56 positive sequence phasor:

$$E_a(m) = X_{pos}(m) \cdot X_{pos}(m-1)^* \quad (16a)$$

$$f_a(m) = f + \frac{f}{\pi} \cdot a\tan\left(\frac{\text{Im}(E_a(m))}{\text{Re}(E_a(m))}\right) \quad (16b)$$

Calculate 62 frequency rate of change based on the calculated frequency:

$$\frac{df}{dt} = 2f \cdot (f_a(m) - f_a(m-1)) \quad (17)$$

Figure 5:
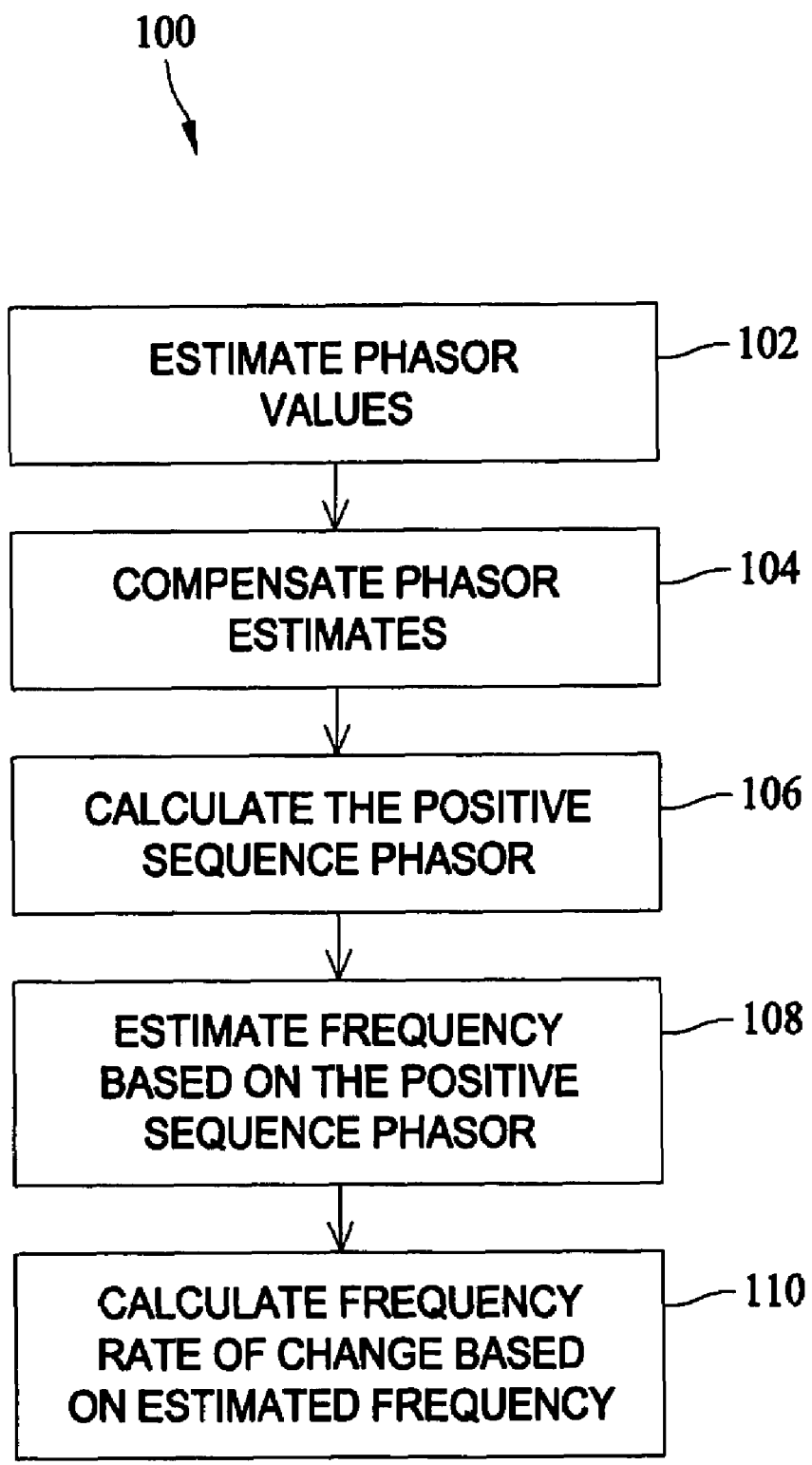
FIG. 5 is a flowchart illustrating another exemplary embodiment of a method of measuring a frequency rate of change.

FIG. 5 is a flowchart illustrating another exemplary embodiment of a method 100 for measuring frequency rate of change, using for example, system 10 (shown in FIG. 1). Method 100 includes estimating 102 current or voltage phasor values, compensating 104 the phasor estimates, calculating 106 the positive sequence phasor, estimating 108 frequency based on the positive sequence phasor, and calculating 110 frequency rate of change based on the estimated frequency. In some embodiments, method 100 may be less accurate than method 50, however, method 100 may not require prior knowledge of frequency.

Although method 100 may be accomplished using any suitable set of equations, one exemplary embodiment described herein with respect to a three-phase electrical power system follows. Although any cycle may be used, note that the phasor calculation is updated every half cycle.

Estimate 102 three phase phasor estimates every half cycle:

$$\overline{X}_a(m) = \frac{\sqrt{2}}{N} \sum_{k=m\frac{N}{2}-\frac{N}{2}}^{m\frac{N}{2}+\frac{N}{2}-1} x_a[(k+1/2) \cdot \Delta t] \cdot e^{-j(k-m\frac{N}{2}+1/2)\frac{2\pi}{N}} \quad (18)$$

$$\overline{X}_b(m) = \frac{\sqrt{2}}{N} \sum_{k=m\frac{N}{2}-\frac{N}{2}}^{m\frac{N}{2}+\frac{N}{2}-1} x_b[(k+1/2) \cdot \Delta t] \cdot e^{-j(k-m\frac{N}{2}+1/2)\frac{2\pi}{N}}$$

$$\overline{X}_c(m) = \frac{\sqrt{2}}{N} \sum_{k=m\frac{N}{2}-\frac{N}{2}}^{m\frac{N}{2}+\frac{N}{2}-1} x_c[(k+1/2) \cdot \Delta t] \cdot e^{-j(k-m\frac{N}{2}+1/2)\frac{2\pi}{N}}$$

wherein: m: Half cycle index.

Compensate 104 the phasor estimates:

$$X_a(m) = \overline{X}_a(m) - j \cdot \frac{\overline{X}_a(m)^* + \overline{X}_a(m-1)^*}{N\sin\left(\frac{2\pi}{N}\right)} \quad (19)$$

$$X_b(m) = \overline{X}_b(m) - j \cdot \frac{\overline{X}_b(m)^* + \overline{X}_b(m-1)^*}{N\sin\left(\frac{2\pi}{N}\right)}$$

$$X_c(m) = \overline{X}_c(m) - j \cdot \frac{\overline{X}_c(m)^* + \overline{X}_c(m-1)^*}{N\sin\left(\frac{2\pi}{N}\right)}$$

Calculate 106 the positive sequence phasor:

$$X_{pos}(m) = \frac{1}{3}[X_a(m) + aX_b(m) + a^2 X_c(m)] \quad (20)$$

where, $a = e^{j\frac{2\pi}{3}}$.

Estimate 108 frequency based on the positive sequence phasor:

$$E(m) = X_{pos}(m) \cdot X_{pos}(m-1)^* \quad (21a)$$

$$f_a(m) = f + \frac{f}{\pi} \cdot a\tan\left(\frac{\text{Im}(E(m))}{\text{Re}(E(m))}\right) \quad (21b)$$

wherein: $f_a$: Frequency estimate.

Calculate 110 frequency rate of change based on the estimated frequency:

$$\frac{df}{dt} = 2f \cdot (f_a(m) - f_a(m-1)) \quad (22)$$

Exemplary embodiments of systems and methods are described and/or illustrated herein in detail. The systems and methods are not limited to the specific embodiments described herein, but rather, components of each system, as well as steps of each method, may be utilized independently and separately from other components and steps described herein. Each component, and each method step, can also be used in combination with other components and/or method steps.

When introducing elements/components/etc. of the assemblies and methods described and/or illustrated herein, the articles "a", "an", "the" and "said" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc.

While the invention has been described in terms of various specific embodiments, those skilled in the art will recognize that the invention can be practiced with modification within the spirit and scope of the claims.

What is claimed is:

1. A method for measuring a rate of change of frequency, said method comprising:
   estimating at least one phasor value;
   estimating a frequency based on the estimated at least one phasor value;
   compensating the estimated at least one phasor value based on the estimated frequency;
   calculating a frequency based on the compensated at least one phasor value;
   calculating a rate of change of the calculated frequency based on the calculated frequency; and
   outputting a signal to an output device when the rate of change of the calculated frequency exceeds a predetermined limit.

2. A method in accordance with claim 1 wherein estimating a frequency comprises estimating a frequency based on at least one rotational rate of the estimated at least one phasor value.

3. A method in accordance with claim 1 wherein estimating a frequency based on at least one rotational rate comprises estimating a frequency based on at least one rotational rate of a positive sequence.

4. A method in accordance with claim 1 wherein compensating the estimated at least one phasor value comprises computing at least one off-nominal phasor correction value based on the estimated frequency.

5. A method in accordance with claim 1 wherein estimating at least one phasor value comprises estimating at least one phasor value using:

$$\overline{X}(m) = \frac{\sqrt{2}}{N} \sum_{k=m\frac{N}{2}-\frac{N}{2}}^{m\frac{N}{2}+\frac{N}{2}-1} x[(k+1/2)\cdot \Delta t]\cdot e^{-j(k-m\frac{N}{2}+1/2)\frac{2\pi}{N}};$$

and
wherein:
m: Half cycle index.

6. A method in accordance with claim 1 wherein estimating a frequency comprises estimating a frequency using:

$$E_{cs}(m) = \overline{X}(m)\cdot \overline{X}(m-1)^*;$$

$$f_{cs}(m) = f + \frac{f}{\pi}\cdot a\tan\left(\frac{\mathrm{Im}(E_{cs}(m))}{\mathrm{Re}(E_{cs}(m))}\right);$$

and
wherein:
$f_{cs}$: Coarse frequency estimate.

7. A method in accordance with claim 1 wherein compensating the estimated at least one phasor value comprises compensating using:

$$\Delta f(m) = f_{cs}(m) - f;$$

$$X(m) = \left[1 + \frac{1}{6}\cdot \pi^2 + \frac{1}{4}\right]\cdot (\Delta f(m)/f)^2\right]\cdot \overline{X(m)};$$

$$\text{and} - \frac{1}{2}\cdot \Delta f(m)/f - \frac{1}{4}\cdot (\Delta f(m)/f)^2\right]\cdot \overline{X(m)}^*.$$

8. A method in accordance with claim 1 wherein calculating a frequency comprises calculating a frequency using:

$$E_a(m) = X(m)\cdot X(m-1)^*; \text{ and}$$

$$f_a(m) = f + \frac{f}{\pi}\cdot a\tan\left(\frac{\mathrm{Im}(E_a(m))}{\mathrm{Re}(E_a(m))}\right).$$

9. A method in accordance with claim 1 wherein calculating a rate of change comprise calculating a rate of change using:

$$\frac{df}{dt} = 2f\cdot (f_a(m) - f_a(m-1)).$$

10. A method in accordance with claim 1 wherein estimating at least one phasor value comprises estimating at least one phasor value every half cycle.

11. A method in accordance with claim 1 wherein estimating at least one phasor value comprises estimating at least one phasor value using:

$$\overline{X}_a(m) = \frac{\sqrt{2}}{N} \sum_{k=m\frac{N}{2}-\frac{N}{2}}^{m\frac{N}{2}+\frac{N}{2}-1} x_a[k+1/2]\cdot \Delta t]\cdot e^{-j(k-m\frac{N}{2}+1/2)\frac{2\pi}{N}};$$

$$\overline{X}_b(m) = \frac{\sqrt{2}}{N} \sum_{k=m\frac{N}{2}-\frac{N}{2}}^{m\frac{N}{2}+\frac{N}{2}-1} x_b[k+1/2]\cdot \Delta t]\cdot e^{-j(k-m\frac{N}{2}+1/2)\frac{2\pi}{N}};$$

$$\overline{X}_c(m) = \frac{\sqrt{2}}{N} \sum_{k=m\frac{N}{2}-\frac{N}{2}}^{m\frac{N}{2}+\frac{N}{2}-1} x_c[k+1/2]\cdot \Delta t]\cdot e^{-j(k-m\frac{N}{2}+1/2)\frac{2\pi}{N}}; \text{ and}$$

wherein: m: Half cycle index.

12. A method in accordance with claim 1 further comprising calculating positive and negative phasor estimates using:

$$\overline{X}_{pos}(m) = \frac{1}{3}[\overline{X}_a(m) + a\overline{X}_b(m) + a^2\overline{X}_c(m)];$$

$$\overline{X}_{neg}(m) = \frac{1}{3}[\overline{X}_a(m) + a^2\overline{X}_b(m) + a\overline{X}_c(m)]; \text{ and}$$

wherein: $a = e^{j\frac{2\pi}{3}}$.

13. A method in accordance with claim 1 wherein estimating a frequency comprises estimating a frequency using:

$$E_{cs}(m) = \overline{X}_{pos}(m)\cdot \overline{X}_{pos}(m-1)^*; \text{ and}$$

$$f_{cs}(m) = f + \frac{f}{\pi}\cdot a\tan\left(\frac{\mathrm{Im}(E_{cs}(m))}{\mathrm{Re}(E_{cs}(m))}\right);$$

wherein: $f_{cs}$: Coarse frequency estimate.

14. A method in accordance with claim 1 wherein compensating the estimated at least one phasor value comprises compensating using:

$$\Delta f(m) = f_{cs}(m) - f;$$

$$X_{pos}(m) = \left[1 + \frac{1}{6}\cdot \pi^2 + \frac{1}{4}\right]\cdot (\Delta f(m)/f)\cdot \overline{X}_{pos}(m); \text{ and} -$$

$$\left[\frac{1}{2}\cdot \Delta f(m)/f - \frac{1}{4}\cdot (\Delta f(m)/f)^2\right]\cdot \overline{X}_{neg}(m)^*.$$

15. A method in accordance with claim 1 wherein calculating a frequency comprises calculating a frequency using:

$$E_a(m) = X_{pos}(m)\cdot X_{pos}(m-1)^*; \text{ and}$$

$$f_a(m) = f + \frac{f}{\pi}\cdot a\tan\left(\frac{\mathrm{Im}(E_a(m))}{\mathrm{Re}(E_a(m))}\right).$$

16. A method in accordance with claim 1 wherein calculating a rate of change comprises calculating a rate of change using:

$$\frac{df}{dt} = 2f \cdot (f_a(m) - f_a(m-1)).$$

17. A method in accordance with claim 4 wherein computing at least one off nominal phasor correction value based on the estimated frequency comprises computing at least one off-nominal phasor correction value using:

$$C \approx 1 + \left(\frac{1}{6} \cdot \pi^2 + \frac{1}{4}\right) \cdot (\Delta f/f)^2; \text{ and}$$

$$D \approx \frac{1}{2} \cdot \Delta f/f - \frac{1}{4} \cdot (\Delta f/f)^2.$$

18. A method for measuring a rate of change of frequency, said method comprising:
estimating at least one phasor value;
compensating the estimated at least one phasor value;
calculating at least one positive sequence phasor value;
estimating a frequency based on the calculated positive sequence phasor value;
calculating a rate of change of the estimated frequency based on the estimated frequency; and
outputting a signal to an output device when the rate of change of the estimated frequency exceeds a predetermined limit.

19. A method in accordance with claim 18 wherein estimating at least one phasor value comprises estimating at least one phasor value using:

$$\overline{X}_a(m) = \frac{\sqrt{2}}{N} \sum_{k=m\frac{N}{2}-\frac{N}{2}}^{m\frac{N}{2}+\frac{N}{2}-1} x_a[(k+1/2) \cdot \Delta t] \cdot e^{-j\left(k-m\frac{N}{2}+1/2\right)\frac{2\pi}{N}};$$

$$\overline{X}_b(m) = \frac{\sqrt{2}}{N} \sum_{k=m\frac{N}{2}-\frac{N}{2}}^{m\frac{N}{2}+\frac{N}{2}-1} x_b[(k+1/2) \cdot \Delta t] \cdot e^{-j\left(k-m\frac{N}{2}+1/2\right)\frac{2\pi}{N}};$$

$$\overline{X}_c(m) = \frac{\sqrt{2}}{N} \sum_{k=m\frac{N}{2}-\frac{N}{2}}^{m\frac{N}{2}+\frac{N}{2}-1} x_c[(k+1/2) \cdot \Delta t] \cdot e^{-j\left(k-m\frac{N}{2}+1/2\right)\frac{2\pi}{N}}; \text{ and}$$

wherein: m: Half cycle index.

20. A method in accordance with claim 18 wherein compensating the estimated at least one phasor value comprises compensating the estimated at least one phasor value using:

$$X_a(m) = \overline{X}_a(m) - j \cdot \frac{\overline{X}_a(m)^* + \overline{X}_a(m-1)^*}{N \sin\left(\frac{2\pi}{N}\right)};$$

$$X_b(m) = \overline{X}_b(m) - j \cdot \frac{\overline{X}_b(m)^* + \overline{X}_b(m-1)^*}{N \sin\left(\frac{2\pi}{N}\right)}; \text{ and}$$

$$X_c(m) = \overline{X}_c(m) - j \cdot \frac{\overline{X}_c(m)^* + \overline{X}_c(m-1)^*}{N \sin\left(\frac{2\pi}{N}\right)}.$$

21. A method in accordance with claim 18 wherein calculating at least one positive sequence phasor value comprises calculating the at least one positive sequence phasor value using:

$$X_{pos}(m) = \frac{1}{3}[X_a(m) + aX_b(m) + a^2 X_c(m)]; \text{ and}$$

where, $a = e^{j\frac{2\pi}{3}}$.

22. A method in accordance with claim 18 wherein estimating a frequency based on the calculated positive sequence phasor value comprises estimating a frequency using:

$$E(m) = X_{pos}(m) \cdot X_{pos}(m-1)^*;$$

$$f_a(m) = f + \frac{f}{\pi} \cdot \operatorname{atan}\left(\frac{\operatorname{Im}(E(m))}{\operatorname{Re}(E(m))}\right); \text{ and}$$

wherein: $f_\alpha$: Frequency estimate.

23. A method in accordance with claim 18 wherein calculating a rate of change of the estimated frequency based on the estimated frequency comprises calculating a rate of change of the estimated frequency using:

$$\frac{df}{dt} = 2f \cdot (f_a(m) - f_a(m-1)).$$

* * * * *